United States Patent [19]

D'Evelyn

[11] Patent Number: 6,152,977
[45] Date of Patent: Nov. 28, 2000

[54] SURFACE FUNCTIONALIZED DIAMOND CRYSTALS AND METHODS FOR PRODUCING SAME

[75] Inventor: Mark Phillip D'Evelyn, Niskayuna, N.Y.

[73] Assignee: General Electric Company, Schenectady, N.Y.

[21] Appl. No.: 09/201,384

[22] Filed: Nov. 30, 1998

[51] Int. Cl.[7] .............................. B24D 3/00; B24D 17/00
[52] U.S. Cl. .............................. 51/309; 51/307; 51/295; 51/293
[58] Field of Search .............................. 51/307, 309, 295, 51/293, 298

[56] References Cited

U.S. PATENT DOCUMENTS

| | | | |
|---|---|---|---|
| 3,904,391 | 9/1975 | Lindstrom et al. | 51/298 |
| 4,063,907 | 12/1977 | Lee et al. | 51/309 |
| 4,435,189 | 3/1984 | Bovenkerk | 51/309 |
| 5,096,465 | 3/1992 | Chen et al. | 51/309 |

OTHER PUBLICATIONS

"Chemical Modification of Diamond Surfaces to Increase Tool Wear Resistance," F.B. Danilova, et al., Soviet Journal of Superhard Marerials, vol. 11, No. 5, 1989, pp. 41–45, (no month).

"Interaction of Chromyl Chloride with Diamond Preparations," S.K. Gordeev, et al. Russian Journal of General Chemistry, vol. 52, No. 6, Jun. 1982, pp. 1071–1072.

"Synthesis of Hydroxyl Functional Groups on the Surface of Diamond," S.K. Gordeev, et al. Russian Journal of Applied Chemistry, vol. 53, No. 1 , Jan. 1980, pp. 81–84.

"Synthesis of Titanium Compounds with Nitrogen on a Diamond Surface," A.B. Zhidkov. Inorganic Material, vol. 26, No. 2, Feb. 1990, pp. 244–246.

"Interaction of Solutions of Alkali–Metal and Alkaline–Earth–Metal Hydroxides with Diamond Preparation." Russian Journal General Chemistry, vol. 53, No. 11, Nov. 1983, pp. 2187–2189.

"Properties of Photochemically Modified Diamond Films," John B. Miller, et al., Diamond and Related Materials 4, Advanced Technology Materials, Inc., Danbury, CT, 1995, pp. 435–440, (no month).

"Synthesis of Hydride Functional Groups on the Surface of Diamond," E.P. Smirnov, et al. Russian Journal of Applied Chemistry, vol. 52, No. 1, Jan. 1979, pp. 176–178.

"Mutual Influence of Functional Groups in Substitution Reactions on Diamond Surface," C.K. Gordeev, et al., Russian Journal of Applied Chemistry, vol. 261, No. 1, Jan. 1982, pp. 6–8.

"Surface Properties of Diamonds," Mark P. D'Evelyn, Chapter IV of Industrial Handbook for Diamond and Diamond Films, edited by M.A. Prelas, et al., Dekker, New York, 1997, pp. 1–35, (no month).

"Interaction of Chlorine with Hydrogenated Diamond Surface," Toshihiro Ando. et al. Journal of the Chinese Chemical Society, 1995, 42, pp. 285–292, (no month).

"Thermal Hydrogenation of Diamond Surfaces Studied by Diffuse Reflectance Fourier–Transform Infrared, Temperature–programmed Desorption and Laser Raman Spectroscopy," T. Ando, et al., J. Chem. Soc. Faraday Trans., 1993, 89,pp. 1783–1789, (no month).

"Chemical Modification of Diamond Surfaces Using a Chlorinated Surface as an Intermediate State," T. Ando, et al. Nat Inst. for Research in Inorganic Materials, Diamond and Related Materials 5 1996 pp. 1136–1142, (no month).

"Synthesis of Halide Functional Groups on the Surface of Diamond," E.P. Smirnov, et al. Russian Journal of Applied Chemistry, vol. 51, No. 11, pp. 2451–2455, Nov. 1978.

Interaction of Titanium Tetrachloride with Diamond Preparations, S.K. Gordeev, et al., Russian Journal of General Chemistry, vol. 52, No. 7 Jul. 1987, pp. 1294–1300.

*Primary Examiner*—Michael Marcheschi
*Attorney, Agent, or Firm*—Ernest G. Cusick; Noreen C. Johnson

[57] ABSTRACT

A method of functionalizing a diamond crystal comprises hydrogenating a diamond crystal, chlorinating the hydrogenated diamond crystal; and exposing the chlorinated diamond crystal to a metal precursor. The exposing step deposits a layer of metal on surfaces of the diamond crystals. The diamond crystal formed by the method possesses surface sites that form a strong bond with the layer of metal to prevent separation thereat, and the layer of metal form strong bonds to a matrix material, for example one of a vitreous and metallic matrix. The functionalized diamond crystal can be used in abrasive products.

5 Claims, 1 Drawing Sheet

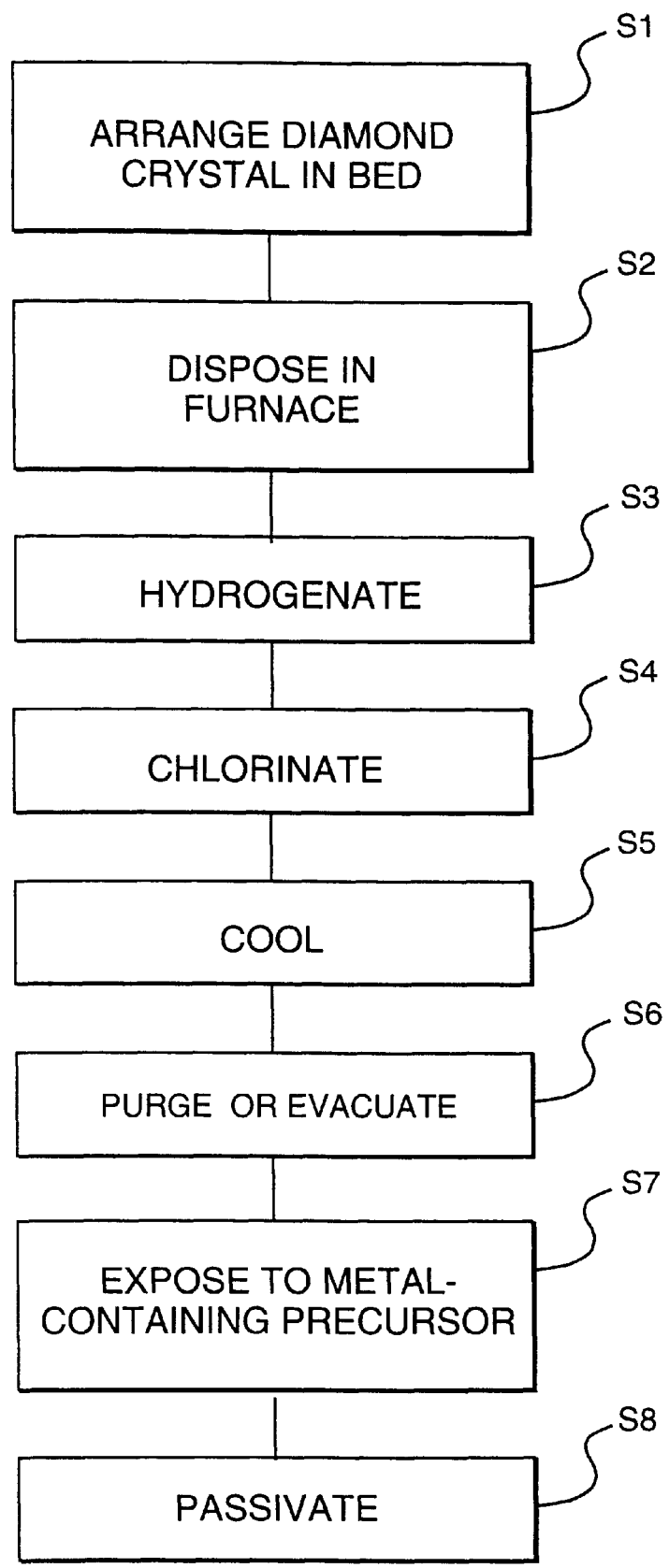

6,152,977

SURFACE FUNCTIONALIZED DIAMOND CRYSTALS AND METHODS FOR PRODUCING SAME

BACKGROUND OF THE INVENTION

The invention relates to surface functionalized diamonds and diamond crystals. The surface functionalized diamonds and diamond crystals exhibit improved bond strengths with coatings and matrix materials. In particular, the invention relates to methods for producing surface functionalized diamonds and diamond crystals that exhibit enhanced bond retention in abrasive products.

Saw blades, grinding wheels, drill bits, and similar abrasive products (hereinafter "abrasive products"), which are used in machining and grinding of hard materials, often comprise diamonds and diamond crystals (hereinafter "diamond crystals"). The diamond crystals are placed in a matrix and are bonded to a tool or device, such as a grinding wheel and a saw blade segment, to form an abrasive product. The diamond crystals comprise naturally occurring diamonds or manufactured (synthetic) diamonds. The manufactured diamonds comprise any synthetic diamond, such as, but not limited to, diamonds manufactured by a high-pressure, high-temperature (HPHT) processes and chemical vapor deposition (CVD) processes. The bond of the matrix and diamond crystals is referred to as an abrasive bond. The abrasive bond is formed by a mechanical or chemical processes, and may comprise metallic, vitreous, or resin bonds.

Some diamond crystals, which are used in abrasive products, comprise a coating layer of metal for enhancing an adhesive bond strength. The coatings may comprise metal films, such as titanium, nickel, copper, and chromium films. The metal coatings are deposited on diamond crystal surfaces by an appropriate process, such as, but not limited to, evaporation and sputter deposition in vacuum. The metal coatings form bonds with the surfaces of the diamond crystals.

Abrasive products often fail during use. The failure can be caused by separation of the diamond crystal from the matrix or de-bonding of the metal coating from the diamond crystal. Improving a bond strength between the diamond crystal and the matrix metal and between the diamond crystal and the metal coating will lead to improved abrasive products tools, increased abrasive product life and value, and superior abrasive product performance.

SUMMARY OF THE INVENTION

The invention sets forth a method for improving a bond strength between a diamond crystal and a matrix material and between the diamond crystal and the metal coating. The method comprises functionalizing a diamond crystal to create diamond crystal surface sites that promote strong bonds with both the metallic coating and the matrix, such as a vitreous or metallic matrix. The functionalizing comprises hydrogenating a diamond crystal; chlorinating the hydrogenated diamond crystal; and exposing the chlorinated diamond crystal to a metal precursor. The exposing step deposits an ultra-thin metal-containing layer on surfaces of the diamond crystals. The diamond crystal formed by the functionalizing method possesses strong bonds with the ultra-thin metal layer at surface sites to prevent separation. The ultra-thin metal layer forms strong bonds with the matrix material. The functionalized diamond crystal can then be used in abrasive products.

These and other aspects, advantages and salient features of the invention will become apparent from the following detailed description, which, when taken in conjunction with the annexed drawing, where like parts are designated by like reference characters throughout, disclose embodiments of the invention.

BRIEF DESCRIPTION OF THE DRAWINGS

The FIGURE is a flow chart of the diamond crystal surface functionalization method.

DESCRIPTION OF THE INVENTION

In this invention, diamonds and diamond crystals (hereinafter "diamond crystals") comprise diamonds that occur naturally in nature and diamonds that are manufactured ("synthetic diamonds"). Manufactured diamond crystals comprise diamonds manufactured by high-pressure, high-temperature (HPHT) processes and chemical vapor deposition (CVD) processes. In the following description, reference to "diamond crystals" includes both natural diamonds and manufactured diamonds, and this language is not meant to limit the invention in any way. Some abrasive products comprise diamond crystals that have a layer of metallic coating bonded thereto. If the bond strength can be enhanced, failure of the abrasive product will be lessened.

As embodied by the invention, diamond crystal surfaces are functionalized to provide enhanced bond strengths (as compared to non-functionalized surfaces) between both a layer of metal and the diamond crystal surface, and the diamond crystals and the matrix. The functionalization process, as embodied by the invention, includes preparation of the diamond crystal surfaces by hydrogenating and chlorinating, exposing the diamond crystals to a metal-containing precursor, and passivating the diamond crystals. The hydrogenating and chlorinating steps form sites where strong bonds between a layer of metal, which is deposited during the exposing step, and diamond surfaces can be formed. These strong bonds lead to improved abrasive products, increased abrasive product life and value, and superior abrasive product performance.

Exemplary processes for functionalizing diamond crystal surfaces will now be discussed with respect to the flowchart of the FIGURE. In step S1, at least one un-functionalized diamond crystal is arranged in a fixed diamond crystal bed. An un-functionalized diamond crystal typically comprises oxygenated surfaces that result from reactions with acids used in recovery of the diamond crystals. The bed of diamond crystals typically can comprise only diamond crystals. Alternatively, the diamond crystals can be loaded with inert particles, such as, but not limited to, quartz beads. The quartz beads prevent flat facets on adjacent diamond crystals from bonding (also known in the art as "seizing") to each other during the functionalizing steps.

The bed of diamond crystals is disposed in an elevated temperature (for example temperatures up to about 1200° C.) environment in step S2. The diamond crystal preparation, as embodied by the invention, is conducted in any suitable elevated temperature environment enclosure, for example, but not limited to, one of a furnace and a hot-wall quartz tube reactor. The process as described herein refers to a furnace, however a furnace is merely exemplary of elevated temperature environment enclosures within the scope of the invention, and is not meant to limit the invention in any way.

The functionalization of the diamond crystals, as embodied by the invention, comprises preparation of the diamond surfaces by the steps of hydrogenating and chlorinating. The hydrogenating step S3 comprises heating the diamond crystals in a hydrogen atmosphere at elevated temperatures to produce hydrogenated diamond crystals. The elevated temperatures are in a range from about 400° C. to about 1200° C. For example, the temperature of the hydrogen atmosphere is about 900° C. The exact hydrogenating temperature depends on the thermal stability characteristics of the diamond crystals.

The hydrogenating step S3 is alternatively performed by subjecting diamond crystals to a hydrogen plasma. Another hydrogenating step S3 alternative comprises exposing the diamond crystals to hydrogen atoms produced by a hydrogen atom source. An appropriate hydrogen atom source comprises, but is not limited to, a hot filament.

The hydrogenated diamond crystals are then chlorinated in step S4. The chlorinating step S4 comprises heating the hydrogenated diamond crystals in a chlorine gas ($Cl_2$) environment to produce chlorinated diamond crystals. The chlorine gas environment comprises one of pure chlorine gas and a gas comprising chlorine with at least one inert gas. The chlorinating step S4 is conducted at temperatures in a range from about 150° C. to about 500° C. The chlorinated diamond crystals now possess surface sites that enable the formation of a strong bond between the diamond crystals and a metal-containing layer. Diamond crystal surfaces typically comprise sites that include C—O—C, >C=O, —OH, —H, and —$CH_x$, where x is in a range from about 1 to about 3, and >represents two bonds.

The chlorinating step S4 is alternatively conducted by photochemical chlorinating or chlorinating using chlorine-containing precursors. These chlorine precursors include, but are not limited to, nitrochloride (NOCl), carbon tetrachloride ($CCl_4$), iodine mono-chloride (ICl), and bromine-chloride (BrCl). Another alternative for the chlorinating step S4 comprises exposing the bed of diamond crystals to a plasma chlorinating process. Further, the chlorinating step S4 can be replaced with a boriding step, in which the hydrogenated diamond is exposed to boron tetrachloride ($BCl_3$) gas at a temperature in a range from about 0° C. to about 500° C. This step forms —$BCl_x$ groups, where x is in a range from about 1 to about 2 at the surface and HCl gas. The —$BCl_x$ groups can then be metallized and passivated. Alternatively, the —$BCl_x$ groups can then be passivated. Either of the steps of metallizing and passivating or simply the step of passivating form boron-metal-oxides (—$BMO_x$) groups or boron oxide (—$BO_x$) groups, where x is in a range from about 0.5 to about 1.5, on the surfaces of the diamond crystals. It is believed that the boron will provide enhanced high-temperature stability and improve bond strength between the layer of metal and the matrix and the diamond crystal surface.

The chlorinated diamond crystals are then cooled in the chlorine-containing environment in step S5. The chlorine-containing environment is removed from the bed of chlorinated diamond crystals in step S6. The chlorine may be removed by evacuating the chlorine gas, for example creating a vacuum to evacuate the chlorine gas, or purging the chlorine gas from the bed of diamond crystals. The purging may comprise passing an inert gas, such as, but not limited to, argon (Ar) and helium (He) gas, through the furnace and bed of diamonds.

The chlorinated diamond crystals are then exposed to a metal-containing precursor, in step S7. The metal-containing precursor exposure step S7 provides a hydrogenated, ultra-thin metal-containing layer, for example a layer of metal with a thickness of about one atom, deposited on diamond crystal surfaces. The hydrogenated, ultra-thin metal-containing layers form strong bonds with sites on the prepared diamond crystal surface. Step S7 is conducted at temperatures in the range from about −200° C. to about 500° C., and is performed at the lowest feasible temperature, for example, room temperature (about 25° C.).

The ultra-thin metal-containing layer may comprise titanium (Ti), aluminum (Al), or silicon (Si), which form an ultra-thin layer comprising $TiC_xN_y$, where x is about 1 and y is about 1, aluminum oxides ($AlO_x$), and silicon oxides ($SiO_x$), where x is in a range from about 1 to about 4 for each of ($AlO_x$) and ($SiO_x$), after a passivating step S8, as discussed below. Further, an ultra-thin metal layer that comprises $AlO_x$, $SiO_x$, and $TiC_xN_y$ may include hydrogen if the passivating step (described hereinafter) exposes the diamond crystals to water vapor.

If an ultra-thin $TiC_xN_y$-containing layer is desired, the metal-containing precursor exposure step S7 deposits an ultra-thin titanium-containing layer on surfaces of the diamond crystal. The ultra-thin titanium-containing layer can be deposited by passing an inert carrier gas, such as, but not limited to, one of helium (He) and argon (Ar) gas, over titanium hydride ($TiH_2$) powder. The passing of inert gas over $TiH_2$ powder is conducted at temperatures in a range from about room temperature to about 400° C. These temperatures permit $TiH_2$ to vaporize into molecules. The $TiH_2$ vapor can become entrained in the passing inert gas to form an inert gas mixture. The inert gas mixture then passes through the bed of chlorinated diamond crystals. An ultra-thin $TiH_x$, where x is in a range from about 1 to about 4, layer is formed by a reaction of $TiH_2$ and the chlorinated diamond crystal surfaces. The reaction of $TiH_2$ and the chlorinated diamond crystal surfaces follows the Equation below.

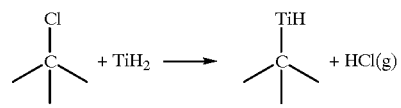

The reaction of $TiH_2$ and the chlorinated diamond crystal surfaces forms hydrogen chloride (HCl) vapor and a hydrogenated ultra-thin layer of $TiH_x$, which exhibits enhanced bond strength to the diamond crystal. The HCl vapor is removed by the carrier gas.

Alternatively, the ultra-thin metal-containing layer can comprise one of an ultra-thin aluminum-containing layer and ultra-thin silicon-containing layer. If an ultra-thin $AlO_x$ layer is desired (after the passivating step S8), the metal-containing precursor exposure step S7 deposits an ultra-thin aluminum-containing layer on the diamond crystal surfaces. The ultra-thin aluminum-containing layer can be deposited by passing trimethylamine alane (($CH_3)_3$N:$AlH_3$) gas through the diamond crystals. If an ultra-thin $SiO_x$ layer is desired (after the passivating step S8), the metal-containing precursor exposure step S7 deposits an ultra-thin silicon-containing layer. The ultra-thin silicon-containing layer can be deposited by passing silane ($SiH_4$) gas through the diamond crystals. In each of the above alternatives, the trimethylamine alane (($CH_3)_3$N:$AlH_3$) and $SiH_4$ gases react with the chlorinated diamond surface to form $AlH_x$ and $SiH_x$ groups, where x is in a range from about 1 to about 4, and HCl and ($CH_3$)N gases, respectively. The HCl and ($CH_3$)N gases are removed by the carrier gas. The chemistry of the reactions of trimethylamine alane (($CH_3)_3$N:$AlH_3$) and $SiH_4$ and the chlorinated diamond crystals is similar to that in the above Equation.

The metal-containing precursor exposure step S7 does not damage a diamond crystal surface lattice. Undamaged surfaces enhance adhesion of the coated diamond crystals to abrasive products. Known diamond crystal surface coating treatments, including rf sputtering, damage diamond crystal surface lattices, and are thus not desirable.

The metal-containing precursor exposure step S7 can be alternatively performed using carbide formers, such as, but not limited to, chromium-, molybdenum-, tungsten-, and zirconium-containing containing precursors, and mixtures thereof. A carrier gas is passed over these metal precursors. The passing of gas over the carbide former precursor is conducted in a manner similar to passing gas over $TiH_2$, as discussed above. The carbide formers produce a hydrogenated, ultra-thin, carbide former-containing layer of metal on diamond crystal surfaces. The ultra-thin, carbide former-containing layers comprise, but are not limited to, ultra-thin chromium-containing, molybdenum-containing, tungsten-containing, and zirconium-containing layers.

A final step of the diamond crystal surface functionalization process, as embodied by the invention, typically comprises passivating the hydrogenated-metal layered diamond crystals, in step S8. The passivating step S8 renders the diamond crystals air stable. The passivating step S8 is typically conducted since hydrogenated-metal layers are not stable in ambient air environments. The coated diamond crystals are passivated in step S8 by passing a gas, which comprises, but is not limited to, at least one of air, dry oxygen ($O_2$), and water vapor, through the coated diamond crystal bed. The passivating step S8 reacts the hydrogenated-metal layered diamond crystals with the passivating gas to produce a stable, ultra-thin metal-containing layer on the diamond crystals. The ultra-thin metal-containing layer comprises $TiC_xN_y$, $AlO_x$, and $SiO_x$ dependent on compositions of the hydrogenated-metal layer and passivating gas. This passivating step is especially practical for $AlH_x$ and $SiH_x$ coated diamond crystals, as they are particularly unstable in ambient air environments.

The passivating step S8 may pass a gas containing water vapor ($H_2O$) through the coated diamonds. Exposure to a water vapor in the passivating step S8 will create an ultra-thin layer that comprises hydrogen (H). For example, if a metal layer comprises $AlO_x$, passivating this metal layer in the presence of water vapor would create ultra-thin layers comprising $AlO_xH_z$, where x has a value in a range from about 0 to about 1.5, z has a value in a range from about 0 to about the value of x. If a metal layer comprises $SiO_x$, passivating this metal layer in the presence of water vapor would create ultra-thin layers comprising $SiO_xH_z$, where x has a value in a range from about 0 to about 1 and z has a value in a range from about 0 to about the value of x. Further, if a metal layer comprises $TiC_xN_y$, passivating this metal layer in the presence of water vapor would create ultra-thin layers comprising and $TiC_xN_yH_z$, where x has a value in a range from about 0 to about 1, y has a value in a range from about 0 to about 1, and z has a value in a range from about 0 to about (x+2y).

Alternatively, the passivating step S8 comprises one of nitriding and carbiding steps. These alternative passivating steps comprise passing at least one of nitrogen-containing and carbon-containing gases, for example nitrogen ammonia ($NH_3$), urea, acetylene, ethylene, and combinations thereof, through the hydrogenated-metal layered diamond crystals. The gas is passed through the diamond crystal bed at temperatures in a range from about 25° C. to about 400° C.

A further alternative passivating step S8 comprises a boriding step. The boriding step exposes the hydrogenated-metal layered diamond crystal surfaces to boron tri-chloride ($BCl_3$) and to at least one of air, $O_2$, and water vapor. These steps render the hydrogenated-metal layered diamond crystal surfaces stable in air.

While various embodiments are described herein, it will be appreciated from the specification that various combinations of elements, variations or improvements therein may be made by those skilled in the art, and are within the scope of the invention.

I claim:

1. A method for forming an abrasive product, the method comprising:

functionalizing a diamond crystal; and depositing the functionalized diamond crystal on a tool to form an abrasive product;

wherein said functionalizing a diamond crystal comprises;

hydrogenating the diamond crystal;

chlorinating the hydrogenated diamond crystal; and exposing the chlorinated diamond crystal to a metal precursor to deposit a layer of metal on surfaces of the diamond crystal.

2. A method according to claim 1, the method further comprising mixing a matrix with the functionalized diamond crystal prior to the step of depositing the functionalized diamond crystal.

3. An abrasive product comprising a surface functionalized diamond crystal and a matrix disposed on a tool, wherein the surface functionalized diamond crystal comprises:

a diamond crystal;

surface sites on a surface of the diamond crystal; and layer of metal disposed on the diamond crystal; where the surface sites comprise groups that enable bonds to form with the layer of metal, where the surface sites are formed by hydrogenating and chlorinating the diamond crystal surface.

4. An abrasive product according to claim 3 wherein the diamond crystals are bonded to a matrix.

5. An abrasive product according to claim 3 wherein the layer of metal is selected from the group consisting of titanium, aluminum, silicon, chromium, molybdenum, zirconium, and tungsten and mixtures thereof.

* * * * *